(12) United States Patent
Eatough et al.

(10) Patent No.: US 7,165,202 B2
(45) Date of Patent: Jan. 16, 2007

(54) METHOD AND APPARATUS TO PERFORM CUSTOMIZED ERROR HANDLING

(75) Inventors: David Arthur Eatough, Herriman, UT (US); James Sferas, Sandy, UT (US)

(73) Assignee: LANDesk Software Limited, Dublin (IR)

( * ) Notice: Subject to any disclaimer, the term of this patent is extended or adjusted under 35 U.S.C. 154(b) by 403 days.

(21) Appl. No.: 09/815,441

(22) Filed: Mar. 22, 2001

(65) Prior Publication Data

US 2002/0184589 A1   Dec. 5, 2002

(51) Int. Cl.
G06F 11/36 (2006.01)
G06F 11/22 (2006.01)

(52) U.S. Cl. .......................... 714/746; 714/57

(58) Field of Classification Search ........... 714/746, 714/57, 44; 713/201; 379/219, 201.01, 379/84, 201.1, 88.11; 707/5, 102; 715/781
See application file for complete search history.

(56) References Cited

U.S. PATENT DOCUMENTS

| | | | |
|---|---|---|---|
| 5,909,215 A * | 6/1999 | Berstis et al. ............... | 715/781 |
| 6,526,529 B1 * | 2/2003 | Miksovsky et al. ........... | 714/57 |
| 6,671,691 B1 * | 12/2003 | Bigus ......................... | 707/102 |
| 2002/0069366 A1 * | 6/2002 | Schoettger ................... | 713/201 |
| 2002/0114438 A1 * | 8/2002 | Ganugapati ............. | 379/201.01 |

* cited by examiner

*Primary Examiner*—Guy Lamarre
*Assistant Examiner*—Dipakkumar Gandhi
(74) *Attorney, Agent, or Firm*—Madson & Austin

(57) ABSTRACT

A method and apparatus to perform customized error handling is described. For example, this method makes it possible to intercept and replace an error code generated by an application. Error messages, such as third party error messages, can be replaced. The application which generates the error message may or may not be updated. The files used by that application may or may not be updated.

4 Claims, 3 Drawing Sheets

METHOD AND APPARATUS TO PERFORM CUSTOMIZED ERROR HANDLING

BACKGROUND

Most operating systems (OS) for a computer are designed to provide error messages when a problem is encountered. For example, an application may require one or more files to complete execution. If an application is executed and one of those files is missing, the OS may detect the missing file and send an error message to the user. Similarly, error messages may be sent for any number of conceivable errors. These error message, however, are typically generic in the sense that they are not configured to convey specific information for the user. Moreover, most error messages are cryptic and fail to provide information regarding how to repair the error.

BRIEF DESCRIPTION OF THE DRAWINGS

The subject matter regarded as embodiments of the invention is particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the embodiments of the invention. It will be understood by those skilled in the art, however, that the embodiments of the invention may be practiced without these specific details. In other instances, well-known methods, procedures, components and circuits have not been described in detail so as not to obscure the embodiments of the invention.

The embodiments of the invention comprise a method and apparatus to perform customized error handling. In one embodiment of the invention, an error may be detected for a system or application. The error typically has a corresponding error message. The embodiment intercepts the error message, and replaces the error message with a customized error message. The content of the customized error message may provide, for example, user specific or organization specific information. Examples of such information may include a Uniform Resource Locator (URL) of a web page providing help, specific help or repair instructions, or contact information for a help desk, although the embodiments are not limited in this context. In this manner, generic error messages may be replaced with customized error messages that may provide more specific and clear information regarding a particular error.

It is worthy to note that any reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
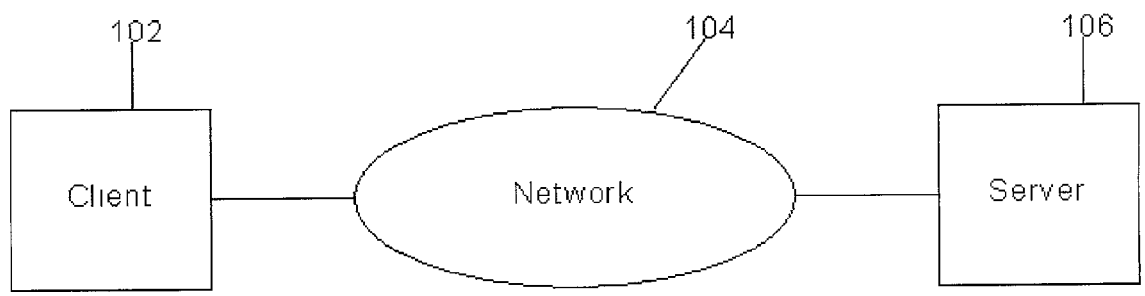
FIG. 1 is a system suitable for practicing one embodiment of the invention.

Referring now in detail to the drawings wherein like parts are designated by like reference numerals throughout, there is illustrated in FIG. 1 a system suitable for practicing one embodiment of the invention. FIG. 1 is a block diagram of a system 100 comprising a client 102 and a server 106, both connected by a network 104. In one embodiment of the invention, client 102 and server 106 may communicate over network 104 using any number of protocols, such as the Transmission Control Protocol (TCP) as defined by the Internet Engineering Task Force (IETF) standard 7, Request For Comment (RFC) 793, adopted in Sep., 1981, and the Internet Protocol (IP) as defined by the IETF standard 5, RFC791, adopted in Sep., 1981, both available from "www.ietf.org" ("TCP/IP Specification"), although the embodiments of the invention are not limited in this context. Although only a single client 102 and server 106 are shown in FIG. 1 for purposes of clarity, it can be appreciated that any number of clients, servers and other network devices may be present and still fall within the scope of the invention.

Figure 2:
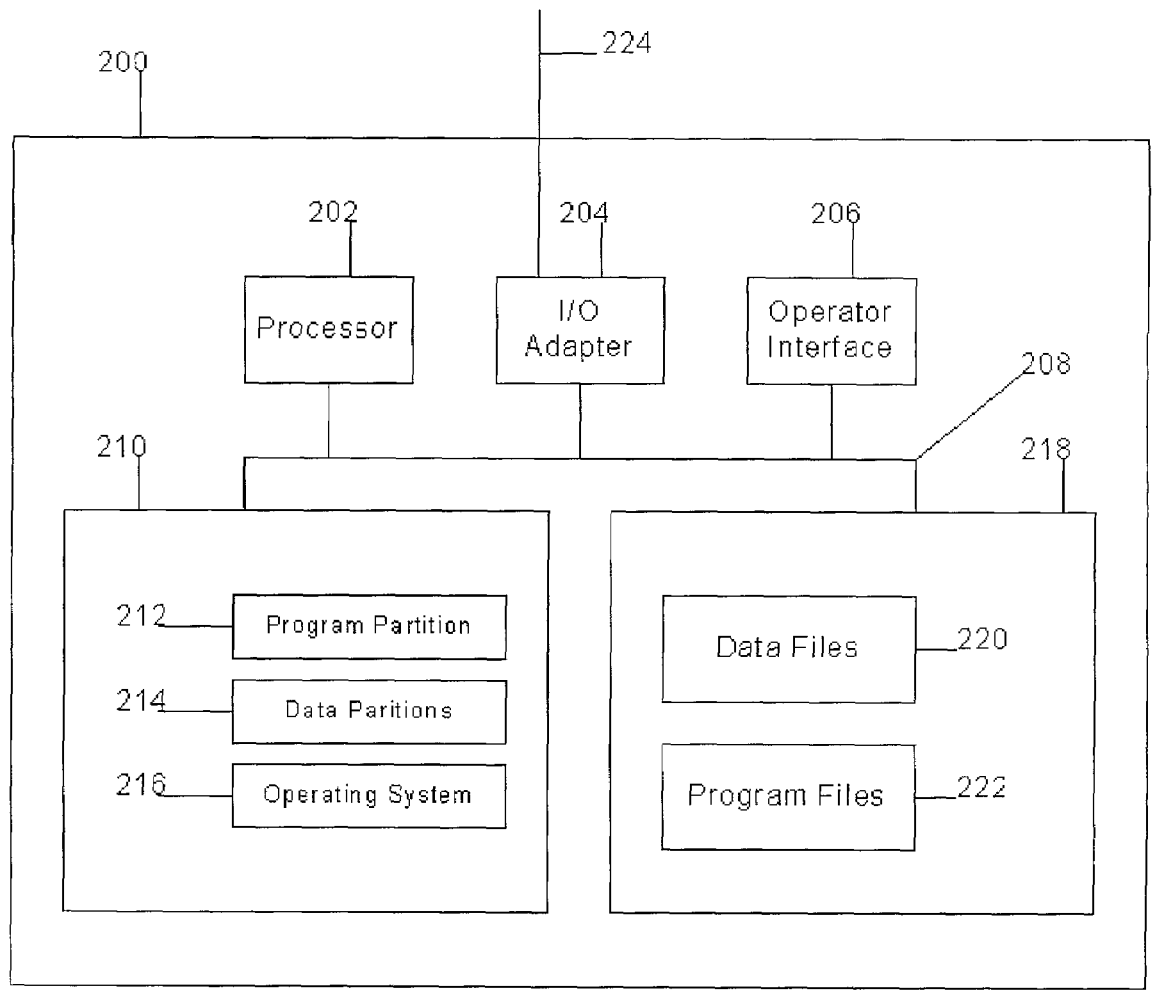
FIG. 2 is a block diagram of a system in accordance with one embodiment of the invention.

FIG. 2 is a block diagram of a system 200 in accordance with one embodiment of the invention. System 200 may be representative of client 102 or server 106, for example. As shown in FIG. 2, system 200 includes a processor 202, an input/output (I/O) adapter 204, an operator interface 206, a memory 210 and a disk storage 218. Memory 210 may store computer program instructions and data. The term "program instructions" may include computer code segments comprising words, values and symbols from a predefined computer language or compiled from a predefined computer language that, when placed in combination according to a predefined manner or syntax, cause a processor to perform a certain function. Examples of a computer language may include Java, C, C++ and assembly. Processor 202 executes the program instructions, and processes the data, stored in memory 210. Disk storage 218 stores data to be transferred to and from memory 210. I/O adapter 204 communicates with other devices and transfers data in and out of the computer system over connection 224. Operator interface 206 may interface with a system operator by accepting commands and providing status information. All these elements are interconnected by bus 208, which allows data to be intercommunicated between the elements. I/O adapter 204 represents one or more I/O adapters or network interfaces that can connect to local or wide area networks such as, for example, the network described in FIG. 1. Therefore, connection 224 represents a network or a direct connection to other equipment.

Processor 202 can be any type of processor capable of providing the speed and functionality required by the embodiments of the invention. For example, processor 202 could be a processor from family of processors made by Intel Corporation, Motorola Incorporated, Sun Microsystems Incorporated, Compaq Computer Corporation and others. Processor 202 may also comprise a digital signal processor (DSP) and accompanying architecture, such as a DSP from Texas Instruments Incorporated.

In one embodiment of the invention, memory 210 and disk storage 218 may comprise a machine-readable medium and may include any medium capable of storing instructions adapted to be executed by a processor. Some examples of such media include, but are not limited to, read-only memory (ROM), random-access memory (RAM), programmable ROM, erasable programmable ROM, electronically erasable programmable ROM, dynamic RAM, magnetic disk (e.g., floppy disk and hard drive), optical disk (e.g., CD-ROM) and any other media that may store digital information. In one embodiment of the invention, the instructions are stored on the medium in a compressed and/or encrypted format. As used herein, the phrase "adapted to be executed by a processor" is meant to encompass instructions stored in a compressed and/or encrypted format, as well as instructions that have to be compiled or installed by an installer before being executed by the processor. Further, client 200 may contain various combinations of machine-readable storage devices through various I/O controllers, which are accessible by processor 202 and which are capable of storing a combination of computer program instructions and data.

Memory 210 is accessible by processor 202 over bus 208 and includes an operating system (OS) 216, a program partition 212 and a data partition 214. In one embodiment of the invention, OS 216 may comprise an OS provided by Microsoft Corporation, such as Microsoft Windows® 95, 98, 2000 and NT, or an OS provided by Sun Microsystems Inc. or Virginia Linux Systems Inc., for example. Program partition 212 stores and allows execution by processor 202 of program instructions that implement the functions of each respective system described herein. Data partition 214 is accessible by processor 202 and stores data used during the execution of program instructions.

In one embodiment of the invention, program partition 212 contains program instructions that may be referred to herein as a customized error-handling (CEH) component. In one embodiment of the invention, the CEH component may perform the functions of monitoring a system for errors and replacing an error message with a customized error message. Although one embodiment of the invention is described in terms of the CEH component, it can be appreciated that the functions performed by this component may be implemented by more than one component and still fall within the scope of the invention.

In one embodiment of the invention, the CEH component may monitor a system for errors. The system may be the same system in which the monitoring component has been deployed, or it may be another system. For example, if the monitoring component was implemented as part of server 106, the monitoring program may be configured to monitor for errors on both server 106 and client 102. The detected error may be for any number of reasons. For example, the error may occur during the initialization or set-up of client 102. In another example, the error may occur during the execution of an application. In any event, the embodiments of the invention may be configured to detect any type of error associated with a system, such as a hardware, firmware or software failure, and still fall within the scope of the invention.

In one embodiment of the invention, the CEH component may replace a system or application error message with a customized error message. The OS typically has access to an error translation table. The OS error translation table may comprise, for example, an error identifier and a corresponding error message for each error detectable by the system or application. The error identifier may be, for example, a number. Once the monitoring component detects an error, it retrieves an error message corresponding to the error number from the OS error translation table. The OS may then send an error message to a display. The CEH component may also maintain an error translation table. The CEH error translation table may contain customized error messages that are different from the error messages stored in the OS error translation table. Once an error is detected, the CEH component intercepts the error message from the OS error translation table and replaces it with the customized error message from the CEH error translation table. The CEH component may then send the customized error message to a display.

In some systems, system operations are suspended while waiting for a response from a user. For example, in a Windows OS environment a dialog box may appear with one or more option buttons. These buttons may be labeled as "Halt", "Continue", "Exit" and so forth. In any event, the system may require the user to select a button prior to resuming operation. The CEH component may manage this process in a number of ways. In one embodiment of the invention, the CEH component may hide the dialog box associated with the original error message and instead display a dialog box with the customized error message. The new dialog box may have buttons that are labeled similarly to the buttons associated with the original error message. Once the user selects a button, the CEH component may select a button associated with the original error message that corresponds to the user-selected button associated with the customized error message. This may allow the system to continue operation in accordance with the user-selected button.

I/O adapter 204 may comprise a network adapter or network interface card (NIC) configured to operate with any suitable technique for controlling communication signals between computer or network devices using a desired set of communications protocols, services and operating procedures, for example. In one embodiment of the invention, I/O adapter 204 may operate, for example, in accordance with the TCP/IP Specification. It can be appreciated, however, that I/O adapter 204 may operate with any suitable technique for controlling communication signals between a computer or network devices using a desired set of communications protocols, services and operating procedures, for example, and still fall within the scope of the invention. I/O adapter 204 also includes appropriate connectors for connecting I/O adapter 204 with a suitable communications medium. I/O adapter 204 may receive communication signals over any suitable medium such as copper leads, twisted-pair wire, co-axial cable, fiber optics, radio frequencies, and so forth.

The operations of systems 100 and 200 may be further described with reference to FIG. 3 and accompanying examples. Although FIG. 3 as presented herein may include a particular processing logic, it can be appreciated that the processing logic merely provides an example of how the general functionality described herein can be implemented. Further, each operation within a given processing logic does not necessarily have to be executed in the order presented unless otherwise indicated.

Figure 3:
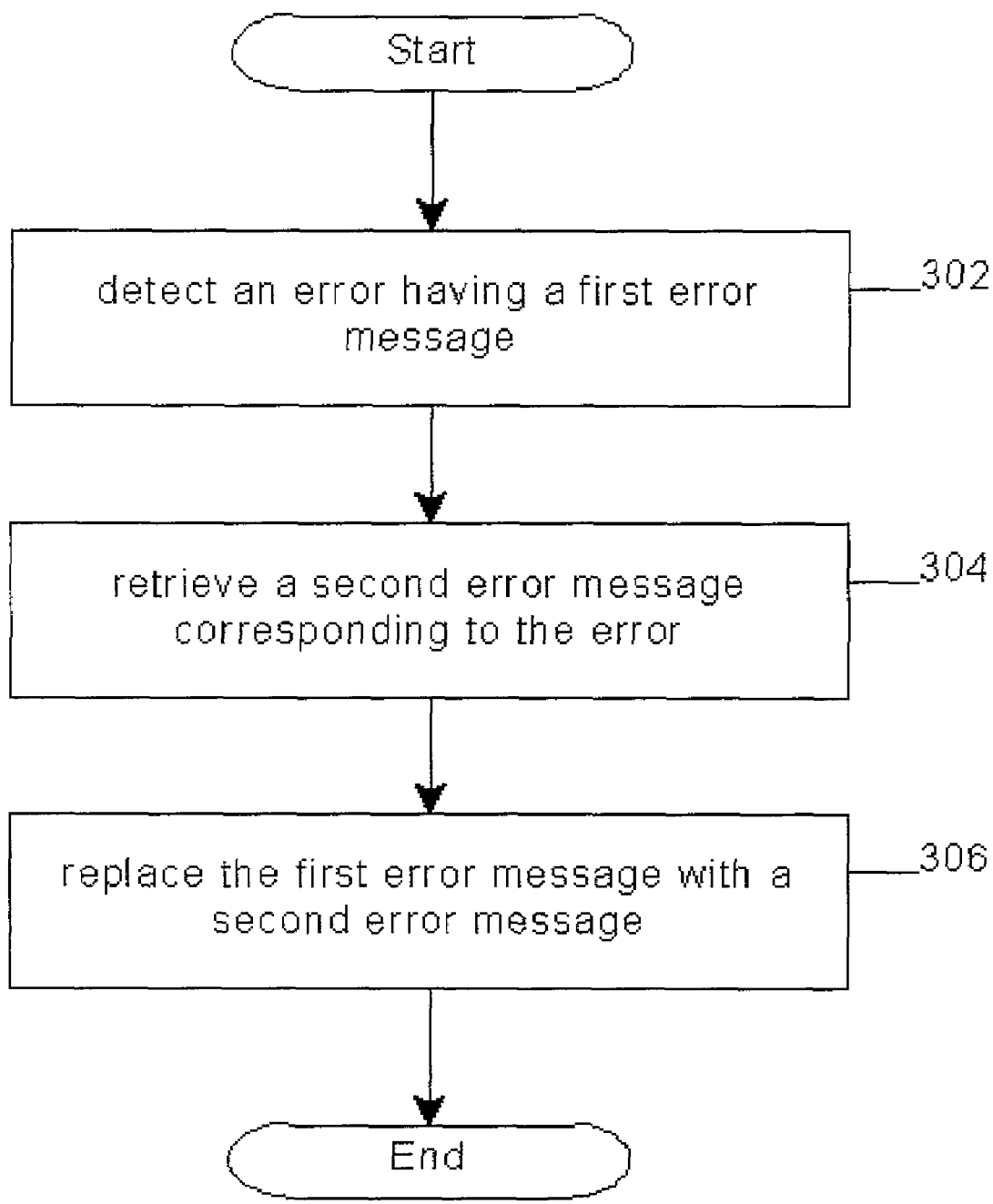
FIG. 3 is a block flow diagram of operations performed by a customized error handling (CEH) component in accordance with one embodiment of the invention.

FIG. 3 is a block flow diagram of the programming logic performed by a customize error handling (CEH) component in accordance with one embodiment of the invention. The term "CEH component" may refer to the hardware, firmware and/or software used to implement the functionality of one embodiment of the invention as described herein. In this embodiment of the invention, the CEH component may be implemented as part of client 102 or server 106, for example. It can be appreciated that this functionality, however, can be implemented by any device, or combination of devices, located anywhere in a communication network and still fall within the scope of the invention.

As shown in FIG. 3, method 300 when executed by a processor, for example processor 202, may perform the programming logic described herein. An error having a first error message is detected at block 302. A second error message corresponding to the error is retrieved at block 304. The first error message is replaced by the second error message at block 306.

The operation of system 100, system 200 and the flow diagram shown in FIG. 3 may be better understood by way of example. A user attempts to initiate execution of an application program in a Windows OS environment by selecting an icon associated with the executable file for the application. The executable file for the application may require one or more files to complete execution, such as a dynamic link library (DLL) file. The OS detects that the execution of the application program has been interrupted due to a missing file. The OS determines the type of error and searches its error translation table for the appropriate error message. An example of an OS error translation table is shown in Table 1.

TABLE 1

| Error | Error Message |
|---|---|
| 1 | DLL file is missing. |
| 2 | Ordinal not found. |

Table 1 may include two fields: an "Error" field and an "Error Message" field. The Error field may comprise an error identifier such as a number that has been assigned to each detectable error. The Error Message field may comprise an error message corresponding to each error number. Once the OS detects that an error has occurred, the OS may retrieve the appropriate error message using, for example, the error number for the detected error. The OS may then send the retrieved error message to a display as part of a dialog box. In this example, the OS detected an error number 1, therefore the OS may display a dialog box having the error message "DLL file is missing." In addition, the displayed dialog box may have one or more buttons labeled with various options for a user. For example, a first button may be labeled as "Resume Operation" and a second button may be labeled as "Cancel Operation." A function may be associated with each button that identifies with the given label. For example, if the user were to select the "Resume Operation" button, the OS may attempt to continue execution of the application without the missing file.

In one embodiment of the invention, a CEH component may be implemented as part of client 102 or server 106. In this embodiment of the invention, the CEH component may detect that an error has occurred in the same system on which the CEH component has been implemented. For example, if the CEH component was implemented as part of server 106, the CEH may be configured to perform customized error handling for server 106.

In one embodiment of the invention, a CEH component may be implemented as part of client 102 or server 106. In this embodiment of the invention, the CEH component may detect that an error has occurred on a different system on which the CEH component has been implemented. For example, if the CEH component was implemented as part of server 106, the CEH may be configured to perform customized error handling for client 102, and vice-versa.

In any event, the CEH component may detect an occurrence of an error. This may be accomplished in any number of ways. For example, the CEH component may detect errors by hooking system or application calls, looking for error dialogs, monitoring active processes, and so forth. The term "hooking calls" as used herein may refer to any of a variety of techniques for modifying existing code in a program. The idea is that it is possible to modify the instruction sequence in a program partition to change the program operation when it is executed. A program partition can be thought of as a sequence of computer instructions. Hooking involves identifying a target sub-sequence of the program partition wherein certain operations occur and modifying it by overwriting it with a new sub-sequence of computer instructions. These new instructions are designed to accomplish the altered operation desired while leaving the program partition otherwise unaffected. To implement a CEH component the sub-sequences where errors can happen or be observed should be identified. The instructions that will result in a call to the operating system for servicing that may cause an error are targeted for modifications. Once the CEH component has control it then makes the call the original code may have previously intended to make. It then examines the outcome of that call and its effect on the system environment to determine if an error occurred.

In one embodiment of the invention, the CEH component may be configured to analyze an application program prior to execution to determine whether an error may occur during execution. For example, the CEH component may be aware of the files necessary to execute a particular application and may search for the presence of such files. If a file is missing, the CEH component may detect that an error would occur upon execution of the application prior to actual execution.

In one embodiment of the invention, the CEH component may be configured to intercept and search all dialog boxes prior to display to determine whether any of them may contain an error message. The CEH component may extract a character string from each dialog box, and search the OS error translation table or the CEH error translation table for the character string. If there is a match, then the CEH component may have a relatively high level of confidence that the dialog box contains an error message.

Once the CEH component detects an error, it may retrieve a customized error message in a number of different ways. In one embodiment of the invention, the CEH component may utilize a CEH error translation table similar to the one shown in Table 2.

TABLE 2

| Error | Customized Error Message |
|---|---|
| 1 | Your application is missing a required DLL file. Please go to www.helpdesk.com to download the missing file. |
| 2 | An ordinal for this application is missing. Please contact your organization help desk at 555-1212. |

Table 2 may include two fields: an "Error" field and a "Customized Error Message" field. The Error field may comprise an error identifier such as a number that has been assigned to each detectable error. In one embodiment of the invention, the error numbers for the CEH error translation table may be the same or similar error numbers used in the OS error translation table. The Customized Error Message field may comprise a customized error message corresponding to an error number. In this embodiment of the invention, once the CEH component detects that an error has occurred, it searches the OS error translation table for the appropriate error number. The search may be accomplished, for example, using a character string comprising the original error message. Once the appropriate error number is determined, the CEH component may search the CEH translation table using the error number to retrieve the customized error message. Referring again to our previous example, if an error number 1 is detected, the CEH component may replace the original error message of "DLL file is missing" with the following customized error message:

"Your application is missing a required DLL file. Please go to www.helpdesk.com to download the missing file."

In one embodiment of the invention, the CEH component may utilize a CEH error translation table similar to the one shown in Table 3.

TABLE 3

| Original Error Message | Customized Error Message |
| --- | --- |
| DLL file is missing. | Your application is missing a required DLL file. Please go to www.helpdesk.com to download the missing file. |
| Ordinal not found. | An ordinal for this application is missing. Please contact your organization help desk at 555-1212. |

Table 3 may include two fields: an "Original Error Message" field and a "Customized Error Message" field. The Original Error Message field may comprise a character string containing the original error message as stored in the OS error translation table. The Customized Error Message field may comprise a character string containing a customized error message. In this embodiment of the invention, once the CEH component detects that an error has occurred, it may search the CEH error translation table for an appropriate customized error message using, for example, a character string comprising the original error message.

In addition to displaying the customized error message, the CEH may also display the same or similar buttons associated with the original error message. Once a user selects a button displayed with the customized error message, the CEH component may select the corresponding button for the original error message that may inform the OS to perform the function associated with the selected button. In the previous example, the original error message was displayed with a first button labeled as "Resume Operation" and a second button labeled as "Cancel Operation." A function may be associated with each button that identifies with the given label. For example, if the user were to select the "Resume Operation" button, the OS may attempt to continue execution of the application without the missing file. In one embodiment of the invention, the customized error message may be displayed with a first button labeled as "Resume Operation" and a second button labeled as "Cancel Operation," both of which mirror the buttons displayed with the original error message. If a user were to select the button labeled as "Cancel Operation" as displayed with the customized error message, for example, the CEH component may send a signal to select the button labeled as "Cancel Operation" that would have been displayed with the original error message. Alternatively, the CEH component may be configured to send a signal with the user's selection directly to the OS.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

The invention claimed is:

1. A method stored in a computer readable medium to perform customized error handling, comprising:
   analyzing an application program prior to execution;
   in response to the analyzing of the application program, detecting a sub-sequence of the application program that, when executed, will cause a first error message to be displayed; and
   prior to execution of the application program, overwriting the sub-sequence of the application program with new instructions that, when executed, will cause a second error message to be displayed.

2. The method stored in a computer readable medium of claim 1, wherein detecting a sub-sequence of the application program that, when executed, will cause a first error message to be displayed further comprises executing the sub-sequence of the application program.

3. The method stored in a computer readable medium of claim 2, wherein detecting a sub-sequence of the application program that, when executed, will cause a first error message to be displayed further comprises examining the outcome of executing the sub-sequence of the application program.

4. The method stored in a computer readable medium of claim 1, wherein detecting a sub-sequence of the application program that, when executed, will cause a first error message to be displayed further comprises searching for the presence of any files that may be requested by the sub-sequence of the application program and determining if the files are present.

* * * * *

UNITED STATES PATENT AND TRADEMARK OFFICE
CERTIFICATE OF CORRECTION

PATENT NO. : 7,165,202 B2
APPLICATION NO. : 09/815441
DATED : January 16, 2007
INVENTOR(S) : David Arthur Eatough et al.

It is certified that error appears in the above-identified patent and that said Letters Patent is hereby corrected as shown below:

In the Title Page Item (73) under "Assignee" please replace "Dublin (IR)" with --Dublin (IE)--.
In the Title Page Item (56) under "References Cited" please add --6,463,147--.
In the Title Page Item (56) under "References Cited" please add --4,453,217--.
In the Title Page Item (56) under "References Cited" please add --6,105,150--.

Signed and Sealed this

First Day of September, 2009

David J. Kappos
*Director of the United States Patent and Trademark Office*